United States Patent
Zolomy et al.

(10) Patent No.: US 9,780,757 B1
(45) Date of Patent: Oct. 3, 2017

(54) TRANSMISSION LINE MATCHING NETWORK AND METHOD THEREFOR

(71) Applicant: Silicon Laboratories, Inc., Austin, TX (US)

(72) Inventors: Attila Zolomy, Budapest (HU); Christopher L. McCrank, Austin, TX (US); Eric Unruh; Tamas Bodi, Budapest (HU); Tibor Herman, Budapest (HU)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 15/169,584

(22) Filed: May 31, 2016

(51) Int. Cl.
*H01Q 11/12* (2006.01)
*H04B 1/04* (2006.01)
*H03H 7/38* (2006.01)

(52) U.S. Cl.
CPC .............. *H03H 7/383* (2013.01); *H04B 1/04* (2013.01)

(58) Field of Classification Search
CPC .......... H04B 1/0458; H03C 7/02; H03C 1/00; H01Q 9/0442; H01Q 7/005; H01Q 23/00; H03F 1/56; H03J 7/16; H03H 7/40; H03H 7/38; H03H 11/245; H01P 5/04; H01J 37/32183; H01L 2924/3011; H01L 23/66
USPC .......... 455/107, 115.1–115.3, 120, 121, 123, 455/125, 129; 333/17.3, 32
See application file for complete search history.

(56) References Cited

U.S. PATENT DOCUMENTS

| | | | |
|---|---|---|---|
| 3,662,294 A | 5/1972 | Jacobs et al. | |
| 5,373,152 A * | 12/1994 | Domon | H04B 10/6973 250/214 AG |
| 5,973,568 A | 10/1999 | Shapiro et al. | |
| 6,879,224 B2 | 4/2005 | Frank | |
| 2006/0138650 A1* | 6/2006 | Hidalgo | H01L 23/66 257/728 |
| 2010/0079211 A1 | 4/2010 | Matsuda et al. | |
| 2015/0365057 A1* | 12/2015 | Kaczman | H03F 1/565 330/296 |

* cited by examiner

*Primary Examiner* — Nhan Le
(74) *Attorney, Agent, or Firm* — Polansky & Associates, P.L.L.C.; Paul J. Polansky (57) ABSTRACT

A hybrid matching network is suitable for use with a radio frequency transmission system having a fundamental frequency and a terminating impedance. The hybrid matching network includes a first port, a first capacitor coupled between the first port and ground and having a self resonance frequency that provides attenuation of at least a first amount of a second harmonic of the fundamental frequency, an inductor coupled between the first port and ground and having an inductance such that a parallel combination of the first capacitor and the inductor has a resonant frequency at the fundamental frequency, a transmission line segment having a first end coupled to the first port, a second end, having a desired physical length and a desired physical width, and a second port coupled to the second end of the transmission line segment and adapted to be coupled to the terminating impedance.

22 Claims, 5 Drawing Sheets

TRANSMISSION LINE MATCHING NETWORK AND METHOD THEREFOR

FIELD OF THE DISCLOSURE

The present disclosure relates generally to radio circuits, and more particularly to impedance matching networks for radio transceivers.

BACKGROUND

In radio frequency (RF) transmission systems, the so-called maximum power transfer theorem states that the maximum amount of power can be transferred to a load resistance when that load resistance is equal to the source resistance of the circuit supplying the power. In the case of an amplifier driving a transmission line, it is important for good power transfer to closely match the output impedance of the amplifier to the impedance of the transmission line. In addition the matching network can suppress harmonics of the carrier frequency to comply with regulatory levels. In known systems, the termination impedance of a transmitter power amplifier can be matched to the transmission line using LC ladder networks. In addition to matching transmission line impedance, LC ladder networks also can suppress unwanted harmonics and help meet governmental regulations for harmonic suppression.

One known LC ladder network is a simple two-element discrete LC ladder network that can be used for lower-power designs. The two-element LC ladder network consists of a series inductor with a shunt capacitor connected to the output side of the inductor. For higher-power designs, one or more additional LC ladder segments may be used to reduce the insertion loss of the ladder network. Both of these LC ladder networks are generally expensive due to the need for expensive high quality (Q) discrete inductors in order for the network to effectively suppress unwanted harmonics of the carrier frequency and to minimize the insertion loss of the matching network. Moreover the capacitors form low-impedance shunts at the harmonic frequencies, but the parasitics of these shunts increase current consumption at the fundamental frequency.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

In one form, a hybrid matching network for use with a radio frequency transmission system having a fundamental frequency and a terminating impedance includes a first port, a first capacitor, an inductor, a transmission line segment, and a second port. The first capacitor is coupled between the first port and ground and has a self resonance frequency that provides attenuation of at least a first amount of a second harmonic of the fundamental frequency. The inductor is coupled between the first port and ground and has an inductance such that a parallel combination of the first capacitor and the inductor has a resonance frequency at the fundamental frequency. The transmission line segment has a first end coupled to the first port, a second end, and has a desired physical length and a desired physical width. The second port is coupled to the second end of the transmission line segment and is adapted to be coupled to the terminating impedance.

In another form, a radio frequency transmission system includes an integrated circuit having a transmitter amplifier providing an output with a fundamental frequency and having a terminal coupled to an output of said transmitter amplifier, and a hybrid matching network coupled between said terminal and a terminating impedance. The hybrid matching network includes a first port, a first capacitor, an inductor, a transmission line segment, and a second port. The first capacitor is coupled between the first port and ground and has a self resonance frequency that provides attenuation of at least a first amount of a second harmonic of the fundamental frequency. The inductor is coupled between the first port and ground and has an inductance such that a parallel combination of the first capacitor and the inductor has a resonant frequency at the fundamental frequency. The transmission line segment has a first end coupled to the first port, a second end, and has a desired physical length and a desired physical width. The second port is coupled to the second end of the transmission line segment and is adapted to be coupled to the transmission line.

In yet another form, a method matches an output of a transmitter amplifier providing a signal having a fundamental frequency and a terminating impedance. A transmission line segment having a desired physical length and a desired physical width is selected. A first capacitor having a self resonance frequency that provides attenuation of at least a first amount of a second harmonic of the fundamental frequency is provided. An inductor having an inductance such that a parallel combination of said first capacitor and said inductor has a resonant frequency at the fundamental frequency. The transmission line segment, the first capacitor, and the inductor are coupled together to form a hybrid matching network for use between the transmitter amplifier and the terminating impedance.

Figure 1:
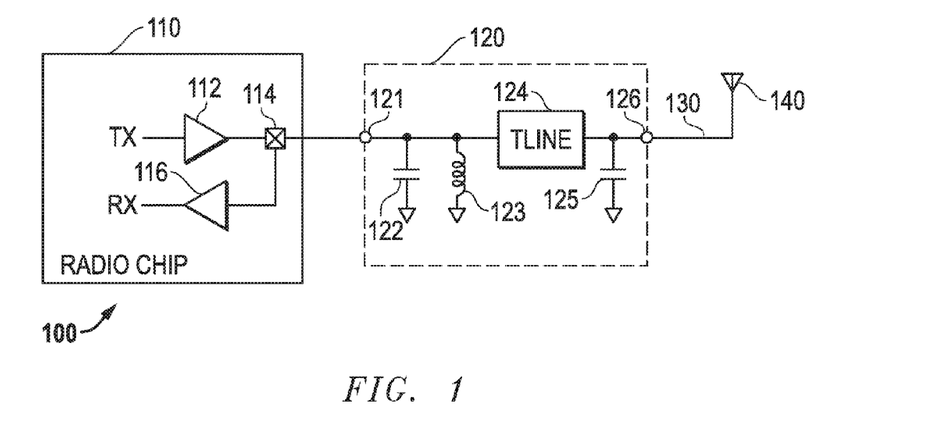
FIG. 1 illustrates in partial block diagram and partial schematic form a radio frequency (RF) transmission system with a hybrid matching network according to an embodiment of the present invention.

FIG. 1 illustrates in partial block diagram and partial schematic form a radio frequency (RF) transmission system 100 with a hybrid matching network 120 according to an embodiment of the present invention. RF transmission system 100 includes generally a radio chip 110, hybrid matching network 120, and a terminating impedance formed by a transmission line 130 and an antenna 140.

Radio chip 110 includes a transmitter amplifier 112, a terminal 114 such as a bonding pad, and a receiver amplifier 116. Transmitter amplifier 112 has an input for receiving a modulated transmit signal labeled "TX", and an output connected to terminal 114. Receiver amplifier 116 has an input connected to terminal 114, and an output for providing a signal labeled "RX".

Hybrid matching network 120 includes a terminal 121, a capacitor 122, an inductor 123, a transmission line segment labeled "TLINE" 124, a capacitor 125, and a terminal 126. Capacitor 122 has a first terminal connected to terminal 121, and a second terminal connected to ground. Inductor 123 has a first terminal connected to terminal 121, and a second terminal connected to ground. Transmission line segment 124 has a first end connected to terminal 121, and a second end connected to terminal 126. Capacitor 125 has a first terminal connected to terminal 126, and a second terminal connected to ground.

Transmission line 130 has a first end connected to terminal 126, and a second end connected to antenna 140. Transmission line 130 can be any suitable form of transmission line such as a coaxial cable or a printed circuit board trace.

Radio chip 110 is an integrated circuit transceiver that may include in various embodiments many of the circuits needed to form the transmission back-end and receive front-end of a radio. For example in one embodiment, radio chip 110 may be formed as a microcontroller unit (MCU) having a central processing unit core that executes stored program instructions for configuration and operation of the radio, channel selection, volume control, etc., and a radio peripheral circuit that performs functions such as mixing, filtering, amplification, and the like. In this case, transmitter amplifier 112 and receiver amplifier 116 form only a part of the radio peripheral. In another embodiment, radio chip 110 may be only the radio peripheral. In yet another embodiment, radio chip 110 may include only a transmitter.

In general, hybrid matching network 120 and the terminating impedance formed by transmission line 130 and antenna 140 matches the output impedance of transmitter amplifier 112 and provides harmonic suppression in an amount suitable for the output power levels used by the application. In an exemplary embodiment, transmission line 130 has a characteristic impedance of 50 ohms ($\Omega$), and is part of a system that uses a 2.45 gigahertz (GHz) carrier frequency. To meet various standards, hybrid matching network 120 ideally would also suppress significantly large harmonics of the 2.45 GHz carrier frequency. A known matching network for low output power levels, for example about 10 decibels with respect to one milliwatt (dBm), consists of a simple two-element discrete LC ladder. The two-element LC ladder network consists of a series inductor with a shunt capacitor connected to the output side of the inductor. A known matching network for higher power levels above 10 dBm consists of a four-element or even higher number of element LCLC ladder network. However these techniques are generally expensive and due to the increased insertion loss consume higher DC supply power with the same output RF power delivered to the termination. For example, they use high quality (Q) inductors for good suppression at harmonics of the carrier frequency and to decrease the insertion loss, but these inductors tend to be expensive.

In order to overcome these deficiencies, the inventors developed hybrid matching network 120. Hybrid matching network 120 uses only a single inductor that can be relatively inexpensive because its Q can be kept low. Moreover hybrid matching network 120 has no series inductors, keeping the insertion loss and thus, the static current consumption low. Hybrid matching network 120 uses two inexpensive surface mount capacitors and leverages the self-resonance of each to provide desired harmonic suppression, unlike conventional LC ladder networks that do not use the self-resonance of the shunt capacitors for harmonic suppression.

The method of selecting appropriate component sizes for use in hybrid matching network 120 will now be described with reference to an exemplary embodiment. In this exemplary embodiment, the termination impedance of transmission line 130 is 50$\Omega$, and radio frequency transmission system transmits a signal using a 2.45 gigahertz (GHz) carrier frequency. In the exemplary embodiment, the matching output termination impedance for transmitter amplifier 112 was determined for each of three different integrated circuit package types that may be used with radio chip 110 because they each have slightly different pin parasitics. The three impedances were plotted using a Smith chart to find a preferred compromise complex impedance value, which was determined to be 23+j11.5$\Omega$.

Hybrid matching network 120 also ideally needs to suppress harmonics of the 2.45 GHz carrier frequency. The impact of capacitors 122 and 125 and inductor 123 on the frequency response characteristic of the exemplary embodiment will next be described, followed by a description of a sequence of steps that can be used to select the values of capacitors 122 and 125 and inductor 123.

Figure 2:
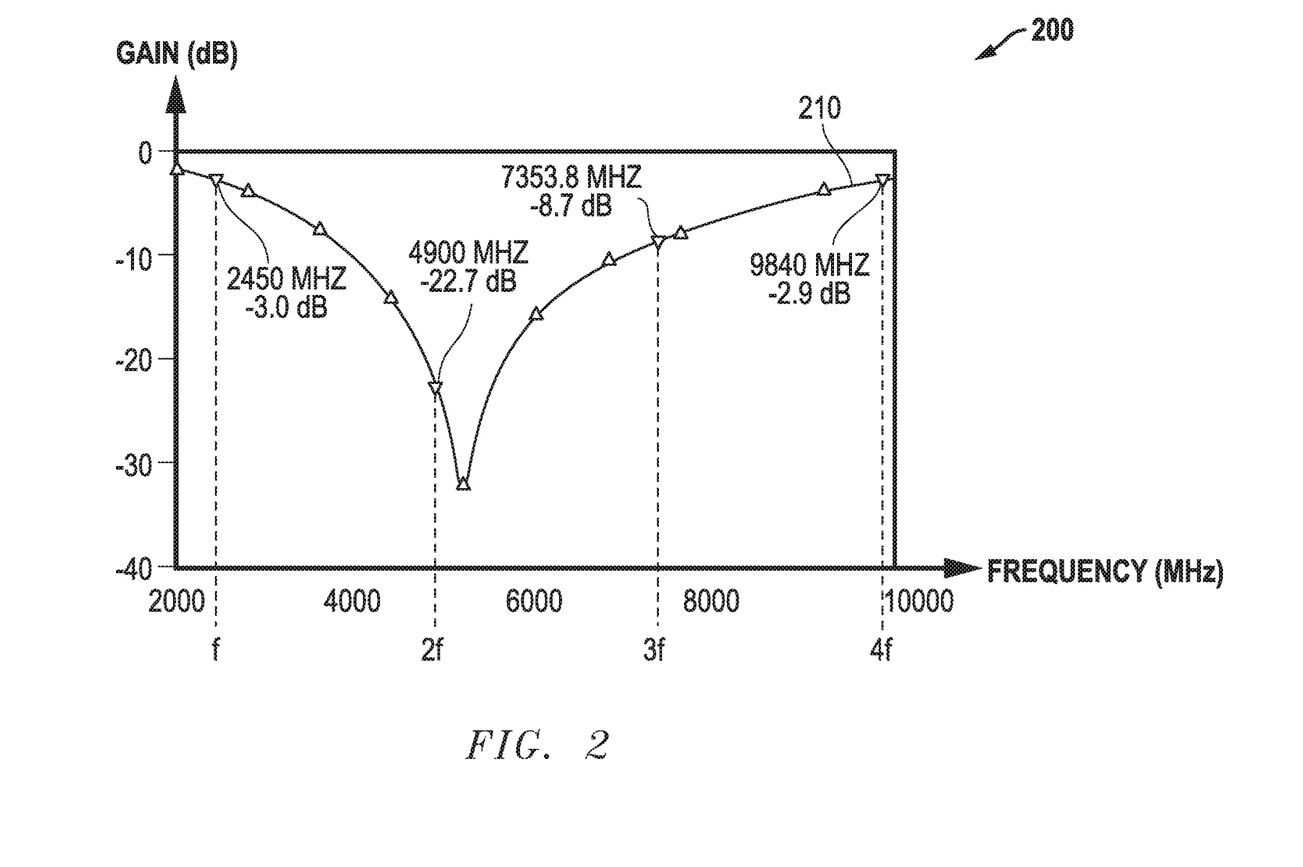
FIG. 2 illustrates a first graph of a frequency response characteristic of the hybrid matching network of FIG. 1.

FIG. 2 illustrates a first graph 200 of a frequency response characteristic of hybrid matching network 120 of FIG. 1. In graph 200, the horizontal axis represents frequency in megahertz (MHz), while the vertical axis represents gain in dB. Graph 200 includes a waveform 210 with a gain that varies with frequency. FIG. 2 illustrates along the horizontal axis the fundamental frequency labeled "f", as well as harmonic frequencies labeled "2f", "3f", and "4f" corresponding to the second, third, and fourth harmonics.

The inventors leveraged the inherent self-resonance of inexpensive surface mount device (SMD) capacitors to construct hybrid matching network 120 without high-Q series inductors. Waveform 210 shows the contribution of capacitor 122 to the frequency response characteristic. In the exemplary 2.4 GHz embodiment, the Murata GRM155 type, size 0402 SMD capacitor having a capacitance of 2 pico-Farads (pF) was chosen for capacitor 122. This capacitor, known as the C0 capacitor, has a low-impedance series self-resonance that falls close to the second harmonic, which is the most significant harmonic, of the 2.45 GHz carrier frequency. Transmission line segment 124 shows 50$\Omega$ at its output port looking into transmission line 130, and also 50$\Omega$ at its input port, and thus is fully transparent. Inductor 123 and capacitor 125 are ignored at this stage of analysis. Because of the inherent self-resonance, capacitor 122 behaves as a $2^{nd}$ order notch filter around its resonant frequency, which falls close to the $2^{nd}$ harmonic of 2.45 GHz. As shown in FIG. 2, capacitor 122 provides about 22.7 dB of suppression at 2f. Capacitor 122 also provides attenuation of about 8.7 dB at 3f and 2.9 dB at 4f, but suffers from an insertion loss of about 3.0 dB at the fundamental frequency f.

Figure 3:
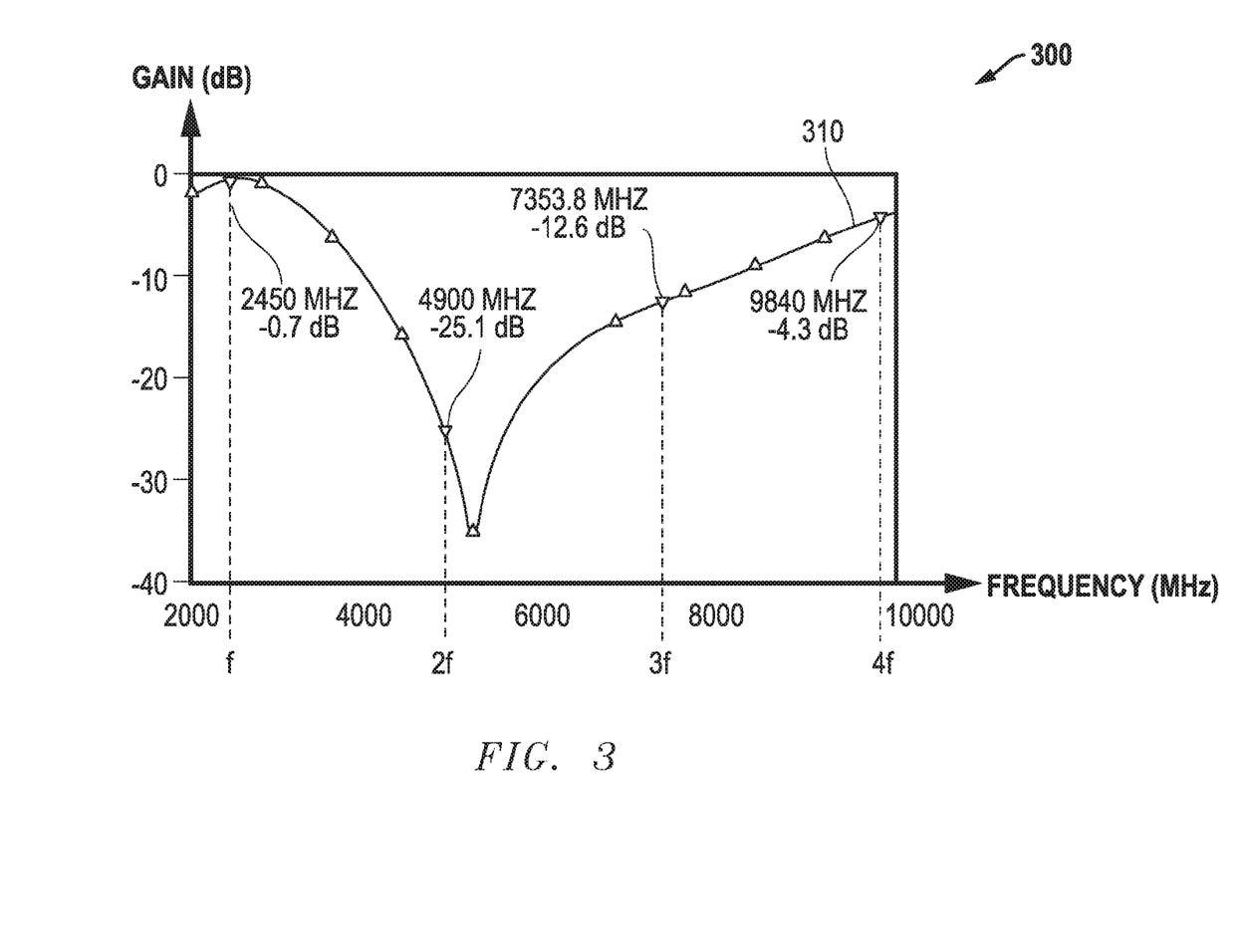
FIG. 3 illustrates a second graph of a frequency response characteristic of the hybrid matching network of FIG. 1.

FIG. 3 illustrates a second graph 300 of a frequency response characteristic of hybrid matching network 120 of FIG. 1. Again in graph 300, the horizontal axis represents frequency in MHz, while the vertical axis represents gain in dB. Graph 300 includes a waveform 310 with a gain that varies with frequency. Capacitor 125 is ignored at this stage of analysis. In the exemplary 2.45 GHz embodiment, a Murata LQG series inductor having an inductance of 1.2 nanoHenrys (nH) was chosen for inductor 123. This inductor, known as the L0 inductor, reduces the insertion loss dramatically by resonating with capacitor 122 (canceling each other out) around the fundamental frequency f. In addition to having a notch near 2f at about 5.0 GHz due to capacitor 122, waveform 310 also shows that the effect of the resonance between capacitor 122 and inductor 123 reduces the insertion loss to about 0.7 dB at the fundamental frequency f.

Figure 4:
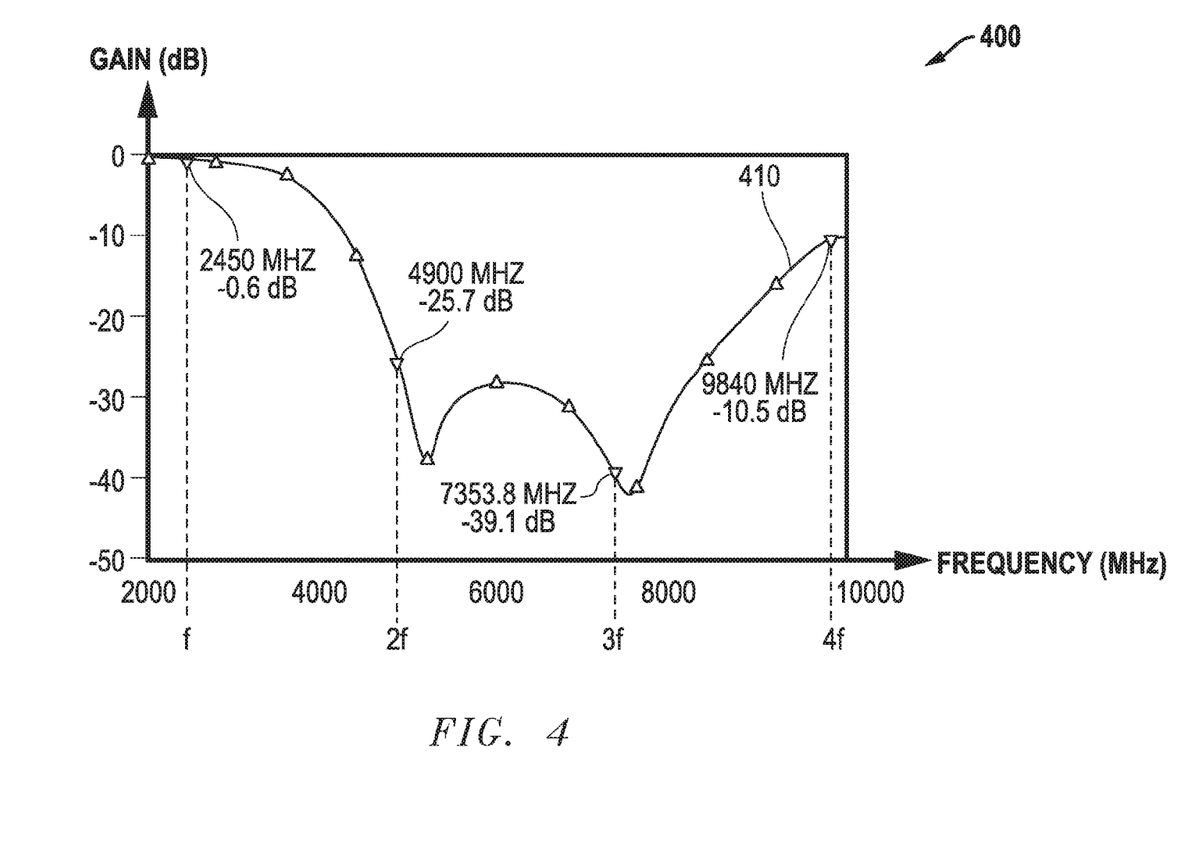
FIG. 4 illustrates a third graph of a frequency response characteristic of the hybrid matching network of FIG. 1.

FIG. 4 illustrates a third graph 400 of a frequency response characteristic of hybrid matching network 120 of FIG. 1. Yet again in graph 400, the horizontal axis represents frequency in MHz, while the vertical axis represents gain in dB. Graph 400 includes a waveform 410 with a gain that varies with frequency. In the exemplary 2.4 GHz embodiment, the Murata GRM155 type, size 0402 SMD capacitor having a capacitance of 0.9 pF was chosen for capacitor 125. This capacitor, known as the C1 capacitor, has a low-impedance series self-resonance that falls close to the third harmonic of the 2.45 GHz carrier frequency. Because of the inherent self-resonance, capacitor 125 behaves as a $2^{nd}$ order notch filter around its resonant frequency, which falls close to the $3^{rd}$ harmonic (3f) of 2.45 GHz. As shown in FIG. 4, capacitors 122 and 125 together provide about 39.1 dB of suppression at 3f and 10.5 dB of suppression at 4f. The addition of capacitor 125 also reduces the insertion loss at the fundamental to about 0.5 dB.

Note that in some systems, the attenuation of capacitor 122 alone may be sufficient to meet prevailing standards for the third and higher harmonics. For example, the U.S. Federal Communications Commission (FCC) standard, sub clause 15.209, specifies a harmonic limit of −41.2 dBm. Note that as shown in FIG. 2, capacitor 122 alone provides an attenuation of 8.7 dB at 3f. In these cases, hybrid matching network 120 may only need to implement capacitor 122, inductor 123, and transmission line segment 124. In the exemplary embodiment, the third and higher harmonic power level limit can be met if the output power level of transmitter amplifier 112 is lower than about 10 dBm.

At higher output power levels, such as 20 dBm, the exemplary embodiment requires about 30 dB of attenuation and for these higher power levels, and the use of capacitor 122 alone is not sufficient. This problem can be solved by adding capacitor 125 with a self-resonance close to 3f. Note that if capacitor 125 were connected in parallel with capacitor 122 and inductor 123, then the shunt self-resonances of both C0 and C1 would be mistuned and not attenuate well at the targeted harmonic frequencies. Moreover, the L0 value would have to be decreased to a practically difficult, small value to preserve the parallel resonance and thus, the low insertion loss at the fundamental frequency f. Both problems can be addressed if the C1 capacitor is separated from the L0-C0 resonator and incorporated into a ladder structure either by a series inductor or by a transmission line segment. However as noted above, series inductors are disadvantageous due to the higher cost and higher loss, so instead hybrid matching network 120 uses transmission line segment 124.

If more self-resonating parallel capacitors were used to suppress additional higher harmonics, they would have to be separated by further series transmission lines. The number of these sections is theoretically unlimited, but practically limited by the increase in the insertion loss.

Note that the separation of capacitor 125 from the capacitor 122—inductor 123 resonator is not the only function of the transmission line segment 124. While the parallel resonant circuit formed by capacitor 122 and inductor 123 is invisible at the fundamental frequency, transmission line segment 124 together with capacitor 125 should generate the desired impedance at the terminal 114. By tuning the characteristic impedance and electrical length of transmission line segment 124, the impedance at terminal 114 can be effectively tuned. Moreover the characteristic impedance of transmission line segment 124 is not necessarily 50Ω, and it can be adjusted properly for the desired impedance at terminal 114. Note that the characteristic impedance and electrical length of transmission line segment 124 can be tuned, e.g., by the variation of physical width and physical length, respectively. While it is possible to tune capacitor 122 and inductor 123 to get the desired impedance, the main tuning element will be transmission line segment 124, since both the C0 and the C1 capacitor values are limited by the need to place their self-resonant frequencies close to the second and third harmonics, respectively.

Accordingly in the exemplary embodiment, transmission line segment 124 has a width of 0.2 millimeters (mm) to give a characteristic impedance of approximately 84Ω and a physical length of 3.5 mm. At this point the other components may be tuned to make the impedance closer to the target impedance of 23+j11.5Ω. This result can be achieved by a slight tuning of capacitor 125 to 0.8 pF and by a slight tuning of the physical length of transmission line segment 124 to 5 mm.

Figure 5:
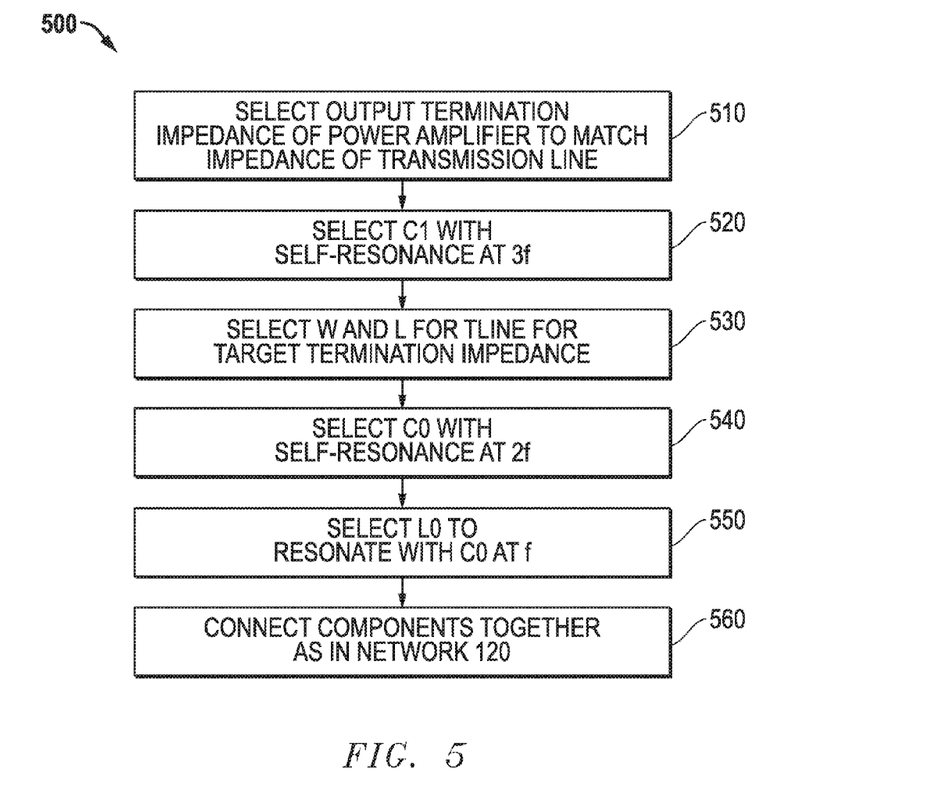
FIG. 5 illustrates a flow diagram of a method of selecting component values for the hybrid matching network of FIG. 1.

FIG. 5 illustrates a flow diagram 500 of a method of selecting component values for hybrid matching network 120 of FIG. 1. At a first action box 510, an output termination impedance of transmitter amplifier 112 is selected to match the impedance of transmission line 130. According to the maximum power transfer theorem, power will be most efficiently transferred to the load when the output impedance of transmitter amplifier 112 matches the impedance of transmission line 130. In this case, the output termination impedance was selected by performing the well-known load-pull test. Since the integrated circuit die of radio chip 110 is intended to be used with three different integrated circuit package types with different parasitic values, the complex impedance was determined for each package type for an output power level of 20 dBm. In this particular example, the three impedances were close together allowing the selection of a good compromise impedance. This compromise impedance was determined to be 23+j11.5Ω and caused less than 0.3 dB loss with any package type. At action box 520, the value of the C1 capacitor that has an inherent self-resonance at the third harmonic (3f) is selected. At action box 530, the width (W) and physical length (L) of transmission line segment 124 is chosen such that, when combined with capacitor 125, tunes the impedance at the output of transmitter amplifier 112 to a target impedance that closely matches the chosen impedance, in this case 23+j11.5Ω. At action box 540, the value of the C0 capacitor that has an inherent self-resonance near the second harmonic (2f) is selected. At action box 550, the value of inductor 123 (L0) is chosen such that it resonates with C0 at frequency f to compensate for the insertion loss. Finally at step 560, components with the values selected according to decision boxes 510-560 are connected together to form hybrid matching network 120.

Figure 6:
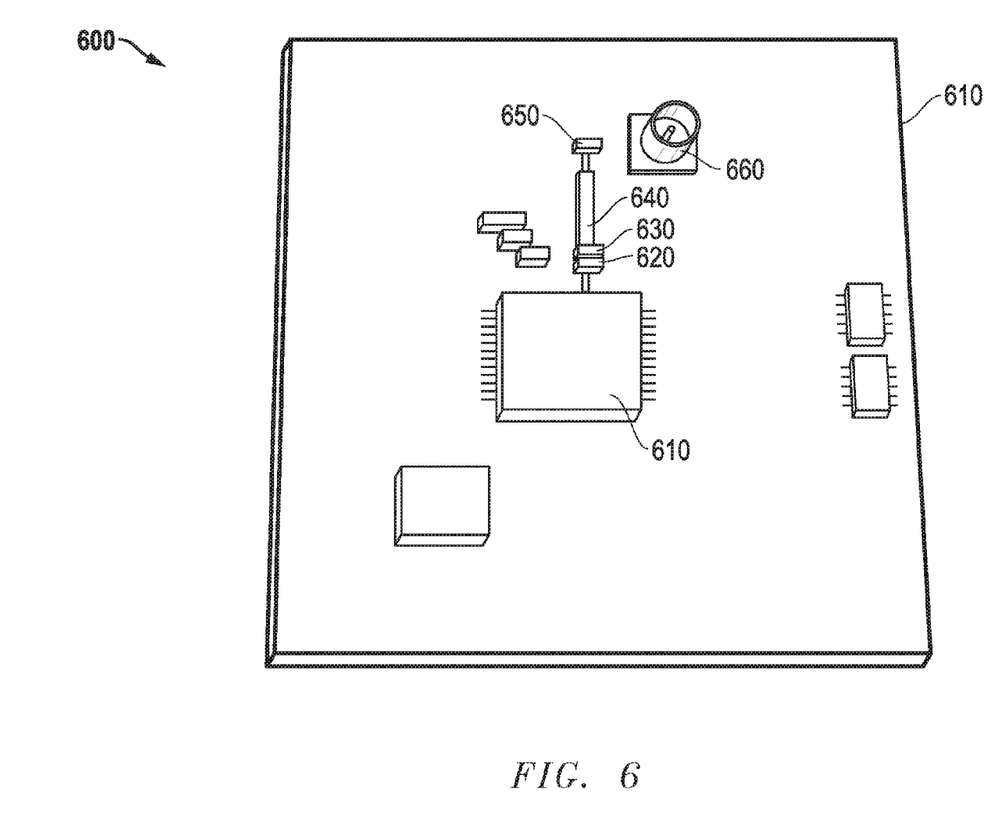
FIG. 6 illustrates a perspective view of a circuit board implementation of the hybrid matching network of FIG. 1.

FIG. 6 illustrates a perspective view of a circuit board 600 implementation of hybrid matching network 100 of FIG. 1. Circuit board 600 includes generally a radio chip 610, an SMD C0 capacitor 620, an SMD L0 inductor 630, a transmission line segment 640, an SMD C1 capacitor 650, and an antenna cable connector 660. FIG. 6 also shows that circuit board 600 has additional electrical components mounted of circuit board 600 that are not relevant to understanding the use of hybrid matching network 120 and will not be described.

The above-disclosed subject matter is to be considered illustrative, and not restrictive, and the appended claims are intended to cover all such modifications, enhancements, and other embodiments that fall within the true scope of the claims. For example in system operating at relatively low transmit power levels, for example less than about 10 dBm, the suppression of the third and higher harmonics may be sufficient to meet regulation such that a C1 capacitor is not needed. Also radio chip 110 can integrate any of a wide variety of radio functions and can be a transmitter-only chip or, as shown in FIG. 1 above, a transceiver chip. In addition in accordance with the principles set forth above the self-resonance values need not provide the lowest gains at the precise harmonic frequencies, but only need to show good enough harmonic suppression for the output power level involved.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A hybrid matching network for use with a radio frequency transmission system having a fundamental frequency and a terminating impedance, comprising:
   a first port;
   a first capacitor coupled between said first port and ground and having a self resonance frequency that provides attenuation of at least a first amount of a second harmonic of the fundamental frequency;
   an inductor coupled between said first port and ground and having an inductance such that a parallel combination of said first capacitor and said inductor has a resonant frequency at the fundamental frequency; and
   a transmission line segment having a first end coupled to said first port, a second end, and having a desired physical length and a desired physical width; and
   a second port coupled to said second end of said transmission line segment and adapted to be coupled to the terminating impedance.

2. The hybrid matching network of claim 1, wherein:
   the fundamental frequency is about 2.45 GigaHertz (GHz);
   a capacitance of said first capacitor is about 2 picoFarads (pF); and
   said inductance of said inductor is about 1.2 nanoHenrys (nH).

3. The hybrid matching network of claim 1, wherein:
   said first capacitor is a surface mount capacitor.

4. The hybrid matching network of claim 1, wherein:
   said transmission line segment is formed on a printed circuit board and has a characteristic impedance that is a function of a width, and said physical length that is a function of a length, of a conductive trace on said printed circuit board.

5. The hybrid matching network of claim 1, further comprising:
   a second capacitor coupled between said second port and ground and having a self resonance frequency that provides attenuation of at least a second amount at a third harmonic of the fundamental frequency.

6. The hybrid matching network of claim 5, wherein:
   said second amount is greater than or equal to said first amount.

7. The hybrid matching network of claim 5, wherein:
   said second capacitor is a surface mount capacitor.

8. A radio frequency transmission system comprising:
   an integrated circuit having a transmitter amplifier providing an output with a fundamental frequency and having a terminal coupled to an output of said transmitter amplifier; and
   a hybrid matching network coupled between said terminal and a terminating impedance having a characteristic impedance, said hybrid matching network comprising:
   a first port;
   a first capacitor coupled between said first port and ground and having a self resonance frequency that provides attenuation of at least a first amount of a second harmonic of said fundamental frequency;
   an inductor coupled between said first port and ground and having an inductance such that a parallel combination of said first capacitor and said inductor has a resonant frequency at said fundamental frequency; and
   a transmission line segment having a first end coupled to said first port, a second end, and having a desired physical length and a desired physical width; and
   a second port coupled to said second end of said transmission line segment and adapted to be coupled to the transmission line.

9. The radio frequency transmission system of claim 8, wherein said integrated circuit further comprises:
   a receiver having an input coupled to said terminal.

10. The radio frequency transmission system of claim 9, wherein:
    said fundamental frequency is about 2.45 GigaHertz (GHz);
    said first capacitor has a capacitance of about 2.5 picoFarads (pF); and
    said inductance of said inductor is about 1.2 nanoHenrys (nH).

11. The radio frequency transmission system of claim 9, wherein:
    said first capacitor is a surface mount capacitor.

12. The radio frequency transmission system of claim 9, wherein:
    said transmission line segment is formed on a printed circuit board and has a characteristic impedance that is a function of a width, and said desired physical length that is a function of a length, of a conductive trace on said printed circuit board.

13. The radio frequency transmission system of claim 9, further comprising:
    a second capacitor coupled between said second port and ground and having a self resonance frequency that provides attenuation of at least a second amount at a third harmonic of said fundamental frequency.

14. The radio frequency transmission system of claim 13, wherein:
    said second amount is greater than or equal to said first amount.

15. The radio frequency transmission system of claim 13, wherein:
    said second capacitor is a surface mount capacitor.

16. A method for matching an output of a transmitter amplifier providing a signal having a fundamental frequency and a terminating impedance, comprising:

selecting a transmission line segment having a desired physical length and a desired physical width;

selecting a first capacitor having a self resonance frequency that provides attenuation of at least a first amount of a second harmonic of the fundamental frequency;

selecting an inductor having an inductance such that a parallel combination of said first capacitor and said inductor has a resonant frequency at the fundamental frequency; and coupling together said transmission line segment, said first capacitor, and said inductor to form a hybrid matching network for use between the transmitter amplifier and the terminating impedance.

17. The method of claim 16, wherein said coupling together comprises:

coupling a first end of said transmission line segment to a first port and a second end of said transmission line segment to a second port;

coupling said first capacitor between said first port and ground; and coupling said inductor between said first port and ground.

18. The method of claim 16, wherein said selecting said transmission line segment having said desired length and said desired width comprises:

selecting a width and a length of said transmission line segment such that it has a characteristic impedance and the desired physical length when formed on a printed circuit board.

19. The method of claim 16, further comprising:

selecting a second capacitor having a self resonance frequency that provides attenuation of at least a second amount of a third harmonic of the fundamental frequency; and said coupling together further comprises coupling said transmission line segment, said first capacitor, said inductor, and said second capacitor together to form said hybrid matching network.

20. The method of claim 19, wherein said coupling together comprises:

coupling a first end of said transmission line segment to a first port and a second end of said transmission line segment to a second port;

coupling said first capacitor between said first port and ground;

coupling said inductor between said first port and ground; and coupling said second capacitor between said second port and ground.

21. The method of claim 16, further comprising:

selecting said desired physical length and said desired physical width of said transmission line segment to match an output impedance of the transmitter amplifier when the transmitter amplifier is coupled to said hybrid matching network through a parasitic impedance.

22. The method of claim 21, wherein said selecting said output impedance of the transmitter further comprises:

determining said parasitic impedance by averaging respective parasitic impedances of each of a plurality of integrated circuit packages.

* * * * *